United States Patent
Lee et al.

(10) Patent No.: US 6,602,782 B2
(45) Date of Patent: Aug. 5, 2003

(54) METHODS FOR FORMING METAL WIRING LAYERS AND METAL INTERCONNECTS AND METAL INTERCONNECTS FORMED THEREBY

(75) Inventors: Myoung-bum Lee, Seoul (KR); Jong-Myeong Lee, Kyungki-do (KR); Byung-hee Kim, Seoul (KR); Gil-heyun Choi, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 72 days.

(21) Appl. No.: 09/862,937

(22) Filed: May 22, 2001

(65) Prior Publication Data

US 2001/0053586 A1 Dec. 20, 2001

(30) Foreign Application Priority Data

May 31, 2000 (KR) .......................................... 2000-29570
Apr. 2, 2001 (KR) .......................................... 2001-17376

(51) Int. Cl.⁷ .............................................. H01L 21/44
(52) U.S. Cl. ........................ 438/674; 438/643; 438/648; 438/625; 438/688; 257/758; 257/751; 257/765; 257/771
(58) Field of Search ................................ 438/643, 648, 438/625, 674, 688, 677; 257/758, 751, 765, 771

(56) References Cited

U.S. PATENT DOCUMENTS

| 6,057,231 A | * | 5/2000 | Givens et al. ............... 438/644 |
| 6,103,086 A | | 8/2000 | Woo et al. ................... 205/164 |
| 6,376,355 B1 | * | 4/2002 | Yoon et al. .................. 438/618 |
| 6,391,769 B1 | * | 5/2002 | Lee et al. .................... 438/643 |

FOREIGN PATENT DOCUMENTS

| JP | 62-291944 | * 12/1987 | ............ H01L/21/88 |
| KR | 97-040236 | 3/1997 | |

OTHER PUBLICATIONS

U.S. application No. 09/136,798, "Method for Forming Metal Interconnection in Semiconductor Device," Filed Aug. 19, 1998.

* cited by examiner

Primary Examiner—Amir Zarabian
Assistant Examiner—Christy Novacek
(74) Attorney, Agent, or Firm—Myers Bigel Sibley & Sajovec PA

(57) ABSTRACT

Methods of forming a metal interconnects include forming an electrically insulating layer having a contact hole therein, on a substrate. A step is also performed to form an electrically conductive seed layer. The seed layer extends on a sidewall of the contact hole and on a portion of an upper surface of the electrically insulating layer extending adjacent the contact hole. The seed layer is sufficiently thick along an upper portion of the sidewall and sufficiently thin along a lower portion of the sidewall that an upper portion of the contact hole is partially constricted by the seed layer and a constricted contact hole is thereby defined. An antinucleation layer is deposited on a portion of the seed layer that extends outside the constricted contact hole. The constricted contact hole is used as a mask to inhibit deposition of the anti-nucleation layer adjacent a bottom of the constricted contact hole. A metal liner is then formed on a portion of the electrically conductive seed layer that defines a sidewall of the constricted contact hole. Next, a metal interconnect layer is reflowed into the constricted contact hole to thereby fill and bury the contact hole.

36 Claims, 4 Drawing Sheets

METHODS FOR FORMING METAL WIRING LAYERS AND METAL INTERCONNECTS AND METAL INTERCONNECTS FORMED THEREBY

RELATED APPLICATION

This application claims priority to Korean Application Nos. 2000-29570 and 2001-17376, filed May 31, 2000 and Apr. 2, 2001, respectively, the disclosures of which are hereby incorporated herein by reference.

FIELD OF THE INVENTION

The present invention relates to methods for manufacturing semiconductor devices, and more particularly, to methods for forming metal wiring layers and interconnects in semiconductor devices and interconnects formed thereby.

BACKGROUND OF THE INVENTION

Metal wiring layers are required for fabricating semiconductor devices on semiconductor substrates. Since metal wiring layers transmit electrical signals, they are required to have low electrical resistance and high reliability and be economical. To meet these demands, aluminum layers have been used as metal wiring layers.

As the integration density of semiconductor devices increases, the width and thickness of aluminum metal wiring layers and the size of contact holes decrease. As a result, the aspect ratio of a contact hole typically increases, and thus a technique of completely filling a high aspect ratio contact hole with an aluminum layer is considered important. Until now, blanket aluminum-chemical vapor deposition (Al-CVD) and selective Al-CVD have been proposed. However, in the case of using blanket Al-CVD, when aluminum is deposited beyond a predetermined thickness, it may show abnormal material characteristics. As a result, the roughness of a wafer surface may be deteriorated, and the entrance of a small-sized contact hole may become blocked by the aluminum such that the contact hole is not completely buried. On the other hand, the application of selective Al-CVD is typically restricted to a particular region, such as a via. In addition, in a case where a barrier metal layer is interposed between an aluminum layer and a source/drain region, it may be difficult to selectively form a metal wiring layer in a contact hole using selective Al-CVD.

To overcome these problems, preferential metal deposition (PMD) has been proposed. In PMD, a barrier metal layer is deposited, and an anti-nucleation layer is formed on the top surface of an interlayer dielectric layer pattern so that a metal wiring layer is selectively deposited on a desired region. However, as shown in FIG. 1, in a conventional PMD process, when a barrier metal layer 4 is positioned at the sidewalls and bottom of a contact hole 3 within an interlayer dielectric layer pattern 2 formed on the substrate 1, anti-nucleation layers 5a and 5b are formed on the barrier metal layer by physical vapor deposition. Accordingly, the thickness and position of the anti-nucleation layers 5a and 5b may vary depending on the shape and size of the contact hole 3.

Specifically, as shown in FIG. 1, in the conventional PMD process, the anti-nucleation layer 5a is formed on the bottom surface of the contact hole 3, and thus a problem may arise because the contact resistance typically increases since the resistance of the anti-nucleation layer 5a is typically greater than the resistance of the barrier metal layer 4. Also, as shown in FIG. 1, the anti-nucleation layer 5b is formed at the upper part of the sidewalls of the contact hole 3. Accordingly, after the formation of the anti-nucleation layers 5a and 5b, an aluminum liner layer 7 typically cannot be uniformly formed at the sidewalls and bottom of the contact hole 3. As a result, in a case where an aluminum metal layer 9 is formed by physical or chemical vapor deposition so as to bury the contact hole, the contact hole 3 may not be completely filled with the aluminum metal layer 9, and a void may occur in the contact hole 3 because the aluminum liner layer 7 is not uniformly formed.

SUMMARY OF THE INVENTION

According to an embodiment of the present invention, an interlayer dielectric layer pattern having a contact hole therein is formed on a semiconductor substrate. A barrier metal layer is formed at the sidewalls and bottom of the contact hole and on the interlayer dielectric layer pattern. A metal seed layer is formed so as to overhang an entrance of the contact hole and make an entrance width of the contact hole smaller than a bottom width of the contact hole. An anti-nucleation layer is formed on the metal seed layer. A metal liner layer is formed on the exposed portions of the metal seed layer and the barrier metal layer where the anti-nucleation layer was not deposited. A metal layer is formed on the surface of the semiconductor substrate on which the metal liner layer and the anti-nucleation layer are formed. A metal wiring layer may be formed by reflowing the metal layer so as to fill the contact hole. The barrier metal layer and the metal seed layer may be formed of a titanium nitride layer. The anti-nucleation layer may be formed of a metal oxide, such as aluminum oxide. The anti-nucleation layer may be formed by depositing an easily oxidizing metal layer on the metal seed layer formed on the top surface of the interlayer dielectric layer pattern and then oxidizing the metal layer. The metal liner layer may be formed by chemical vapor deposition. The metal liner is deposited so as not to block an upper part of the contact hole. The metal liner layer and the metal layer may be formed of aluminum.

According to another preferred embodiment of the present invention, a metal interconnect may be formed on a semiconductor substrate by forming an electrically insulating layer having a contact hole therein, on the substrate and then forming an electrically conductive seed layer that extends on a sidewall of the contact hole and on a portion of an upper surface of the electrically insulating layer extending adjacent the contact hole. The seed layer is formed to be sufficiently thick along an upper portion of the sidewall and sufficiently thin along a lower portion of the sidewall that an upper portion of the contact hole is partially constricted by the electrically conductive seed layer and a constricted contact hole is thereby defined. An anti-nucleation layer is also formed on a portion of the electrically conductive seed layer that extends outside the constricted contact hole. Here, the constricted contact hole is used as a "mask" to inhibit formation of the anti-nucleation layer adjacent a bottom of the constricted contact hole. A metal liner is then formed on a portion of the electrically conductive seed layer that defines a sidewall of the constricted contact hole. Following formation of the metal liner, a metal interconnect layer is reflowed into the constricted contact hole.

According to a preferred aspect of this embodiment, the step of forming an anti-nucleation layer preferably comprises the steps of depositing an oxidizable metal layer on a portion of the electrically conductive seed layer that extends outside the constricted contact hole. Here, the constricted contact hole is used as a mask to at least inhibit deposition of the oxidizable metal layer adjacent a bottom of the constricted contact hole. Next, the oxidizable metal layer is converted into the anti-nucleation layer by exposing the oxidizable metal layer to an oxygen-containing ambient. The oxidizable metal layer and the metal liner may be the same material (e.g., aluminum or an aluminum alloy, etc.). The metal liner and the metal interconnect layer may also be the same material.

The step of forming an electrically conductive seed layer may also be preceded by the step of forming a barrier metal layer that contacts the sidewall of the contact hole and the portion of an upper surface of the electrically insulating layer extending adjacent the contact hole. The electrically conductive seed layer and the barrier metal layer are preferably the same material (e.g., a refractory metal such as titanium nitride). According to another preferred aspect of this embodiment, the step of forming a barrier metal layer may comprise depositing the barrier metal layer using a first ratio of first and second source gases and the step of forming an electrically conductive seed layer may comprise depositing the electrically conductive seed layer using a second ratio of the first and second source gases. The first and second ratios are designed so that a step coverage of the barrier metal layer is greater than a step coverage of the electrically conductive seed layer. In particular, the first source gas may comprise titanium and the first ratio is preferably greater than about four times the second ratio and, more preferably, the first ratio is about eight (8) times greater than the second ratio. The first and second source gases may comprise titanium chloride and ammonia, respectively.

Metal interconnects according to additional embodiments of the present invention include a semiconductor substrate and an electrically insulating layer having a contact hole therein, on the substrate. An electrically conductive seed layer extends on a sidewall of the contact hole and on a portion of an upper surface of the electrically insulating layer extending adjacent the contact hole. The seed layer is sufficiently thick along an upper portion of the sidewall and sufficiently thin along a lower portion of the sidewall that an upper portion of the contact hole is partially constricted by the electrically conductive seed layer and a constricted contact hole is thereby defined. An anti-nucleation layer (e.g., metal oxide layer) extends on a portion of the electrically conductive seed layer extending outside the constricted contact hole, but preferably not on a bottom of the constricted contact hole. A metal liner extends on a portion of the electrically conductive seed layer that defines a sidewall of the constricted contact hole and a metal interconnect layer extends into the constricted contact hole and electrically contacts the metal liner on the inside of the constricted contact hole and contacts the anti-nucleation layer on the outside of the constricted contact hole. According to a preferred aspect of this embodiment, the step coverage characteristics of the barrier metal layer are greater than step coverage characteristics of the electrically conductive seed layer.

According to still another embodiment of the present invention, a method of forming a metal interconnect comprises forming an electrically insulating layer having a contact hole therein, on a substrate, and then depositing an electrically conductive barrier metal layer along a sidewall and bottom of the contact hole and on an upper surface of the electrically insulating layer. This step is performed using a first composite gas having a first composition that provides a first degree of step coverage to the barrier metal layer. Next, an electrically conductive seed layer is deposited that extends on the barrier metal layer and in the contact hole. This step is performed using a second composite gas having a second composition that provides a second degree of step coverage to the seed layer that is less than the first degree of step coverage and causes the seed layer to overhang the contact hole. An anti-nucleation layer is then formed on a portion of the seed layer extending outside the contact hole. The formation of the anti-nucleation layer is followed by the step of forming a metal liner on a portion of the seed layer extending within the contact hole. A metal interconnect layer is then reflowed into the contact hole.

DESCRIPTION OF PREFERRED EMBODIMENTS

Figure 1:
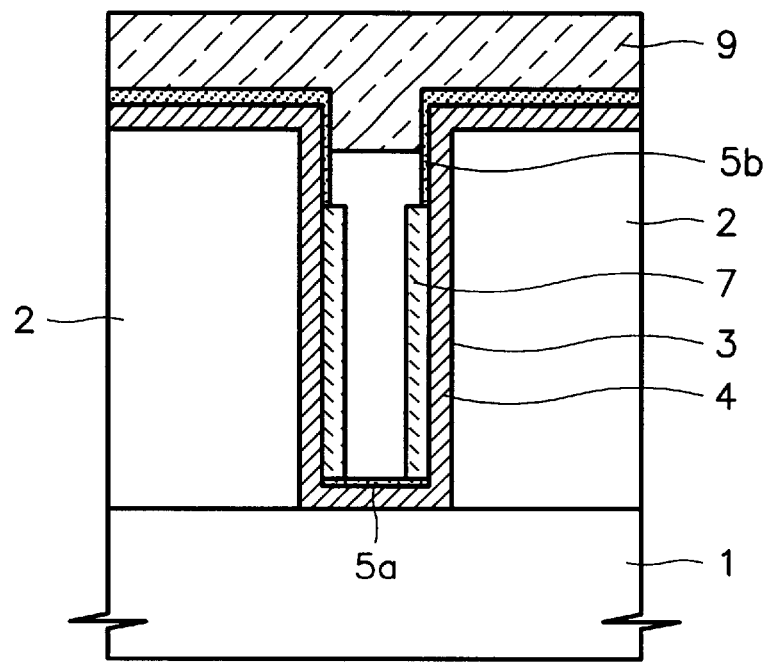
FIG. 1 is a cross-sectional view illustrating a method for forming a metal wiring layer of a semiconductor device using conventional preferential metal deposition.

The present invention now will be described more fully with reference to the accompanying drawings, in which a preferred embodiment of the invention is shown. This invention may, however, be embodied in many different forms and should not be construed as being limited to the embodiment set forth herein; rather, this embodiment is provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
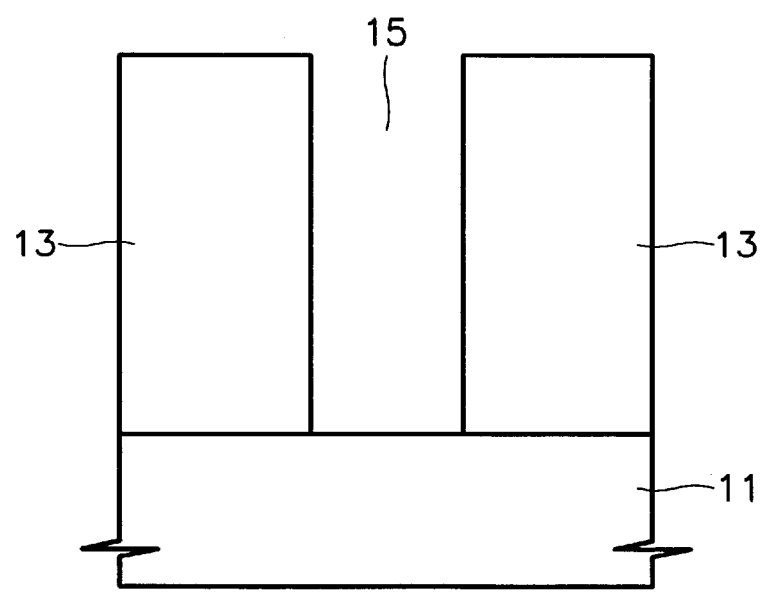
FIGS. 2 through 7 are cross-sectional views illustrating a method for forming a metal wiring layer of a semiconductor device using preferential metal deposition according to an embodiment of the present invention.

FIGS. 2 through 7 are cross-sectional views illustrating a method for forming a metal wiring layer of a semiconductor device using physical metal deposition (PMD) according to an embodiment of the present invention. Referring to FIG. 2, an interlayer dielectric layer pattern 13 having a contact hole 15 is formed on a semiconductor substrate 11. Specifically, an interlayer dielectric layer (not shown) is formed on the semiconductor substrate 11 and is patterned, thereby forming the interlayer dielectric layer pattern 13 which has the contact hole 15 therein exposing the semiconductor substrate 11. The interlayer dielectric layer pattern 13 may be formed of a silicon oxide layer. The contact hole 15 shown in FIG. 1 has been described as the contact hole 15 exposing the semiconductor substrate 11, however, in a case where a lower metal layer (not shown) is positioned on the semiconductor substrate 11, the contact hole 15 may become a via hole exposing the lower metal layer.

Figure 3:
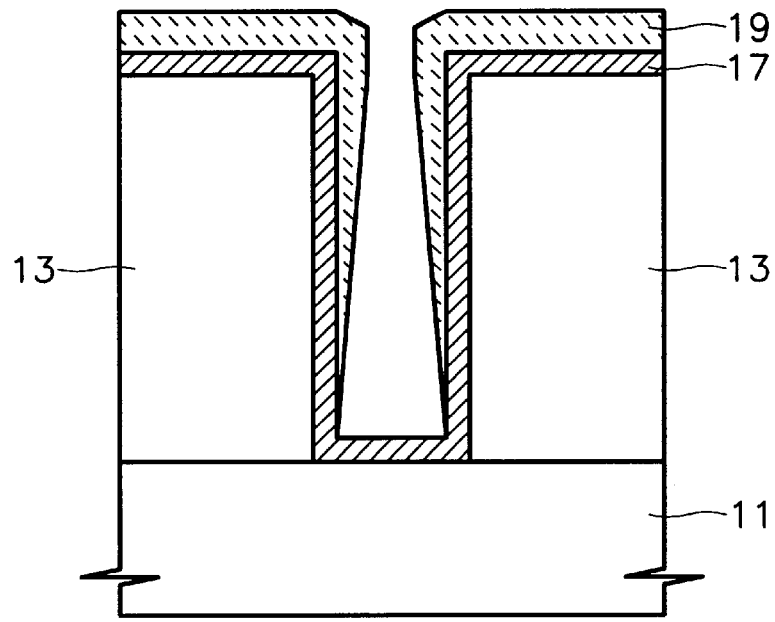

Referring to FIG. 3, a barrier metal layer 17 is formed over the entire surface of the semiconductor substrate on which the interlayer dielectric layer pattern 13 is formed. The barrier metal layer 17 can be used to prevent silicon atoms in the semiconductor substrate 11 from reacting with a metal layer, such as an aluminum layer, to be formed in a subsequent process. The barrier metal layer 17 is formed to have a sufficient thickness to show excellent step coverage along the sidewalls of the contact hole 15 and the surface of the interlayer dielectric layer pattern 13. The barrier metal layer 17 may be formed by chemical vapor deposition (CVD). The metal barrier layer 17 may be formed to have a thickness of about 100 to about 300 Å. The barrier metal layer 17 may be formed of a refractory metal layer or a refractory metal nitride layer.

For example, the barrier metal layer 17 may be formed as a TiN layer. In the case of forming the TiN layer using CVD, the TiN layer is preferably deposited using a $TiCl_4:NH_3:N_2$ composite gas at flow rates of 40 sccm:60 sccm:3000 sccm, respectively, and at a pressure of about 20 Torr and a temperature in a range between about 500 to about 650° C. Under these conditions, the barrier metal layer 17 may exhibit a step coverage of at least about 90% for a contact hole aspect ratio of 10. If necessary, the barrier metal layer 17 is thermally treated using heat treatment or a rapid thermal process in a furnace in order to obtain a satisfactory barrier effect of the barrier metal layer 17.

Next, a metal seed layer 19 is formed on the barrier metal layer 17 so that the metal seed layer 19 overhangs the entrance of the contact hole 15. In other words, due to the metal seed layer 19, the upper entrance width of the contact hole 15 is smaller than the bottom width of the contact hole 15. The metal seed layer 19 may be formed by chemical vapor deposition. The metal seed layer 19 may be formed on the metal barrier layer 17 to have a thickness in a range between about 150 to about 300 Å. The metal seed layer 19 is preferably formed of a refractory metal layer or a refractory metal nitride layer, however, other metals and metal alloys may be used.

For example, the metal seed layer 19 may be formed as a TiN layer which is a refractory metal nitride layer. In this case, the TiN layer is preferably deposited using a $TiCl_4:NH_3:N_2$ composite gas at a flow rate of 5 sccm:60 sccm:3000 sccm and at a pressure of about 20 Torr and a temperature in a range between about 500 to about 650° C. Under these conditions, the metal seed layer 19 may exhibit a step coverage of typically only about 5% or less for a contact hole aspect ratio of 10.

In the present embodiment, the barrier metal layer 17 and the metal seed layer 19 are formed by chemical vapor deposition (CVD). However, another deposition method, such as physical vapor deposition (PVD), metal organic CVD, collimated sputtering, ionized metal physical vapor deposition (IMPVD), or any combination thereof may be used, so long as the deposition method can satisfy the preferred deposition and step coverage conditions described herein. For example, the barrier metal layer 17 may be formed by IMPVD having excellent step coverage or collimated sputtering, and the metal seed layer 19 may be formed by physical or chemical vapor deposition having poorer step coverage. In the present invention, $TiCl_4$ is used as a Ti source for the formation of the barrier metal layer 17 and the metal seed layer 19. Tetrakis dimethyl amino titanium (TDMAT) or tetrakis diethyl amino titanium (TDEAT) can also be used, for example.

Figure 4:
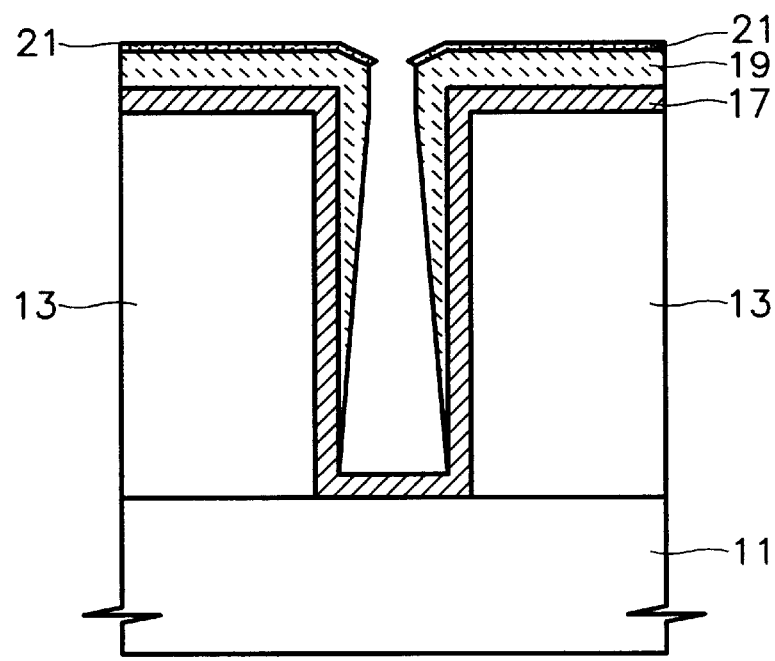

Referring to FIG. 4, an anti-nucleation layer 21 is selectively formed on the metal seed layer 19 positioned on the top surface of the interlayer dielectric layer pattern 13. The anti-nucleation layer 21 may be formed by depositing an easily oxidizing metal layer (not shown) on the metal seed layer 19 and then oxidizing the oxidizable the metal layer into a metal oxide layer (e.g., through exposure to the atmosphere or an oxygen plasma treatment). In the present embodiment, the anti-nucleation layer 21 may be formed of an aluminum oxide layer having a thickness of about 100 Å.

As the anti-nucleation layer 21 should be formed only on the outside of the contact hole 15, physical or chemical vapor deposition having poor step coverage, such as sputtering, can be used. Due to the metal seed layer 19 overhanging the entrance of the contact hole 15 and thereby constricting the contact hole, the anti-nucleation layer 21 cannot be easily deposited on the metal seed layer 19 formed at the sidewalls or bottom of the contact hole 15, and thus the metal seed layer 19 formed at the sidewalls of the contact hole 15 can remain exposed. Accordingly, in the illustrated embodiment, the anti-nucleation layer 21 is preferably not formed on the portion of the barrier metal layer 17 that extends adjacent the bottom of the contact hole 15 or on the sidewall of the metal seed layer 19 within the constricted contact hole. Preventing the formation of the anti-nucleation layer 21 at the bottom of the contact hole 15 can improve contact resistance.

Figure 5:
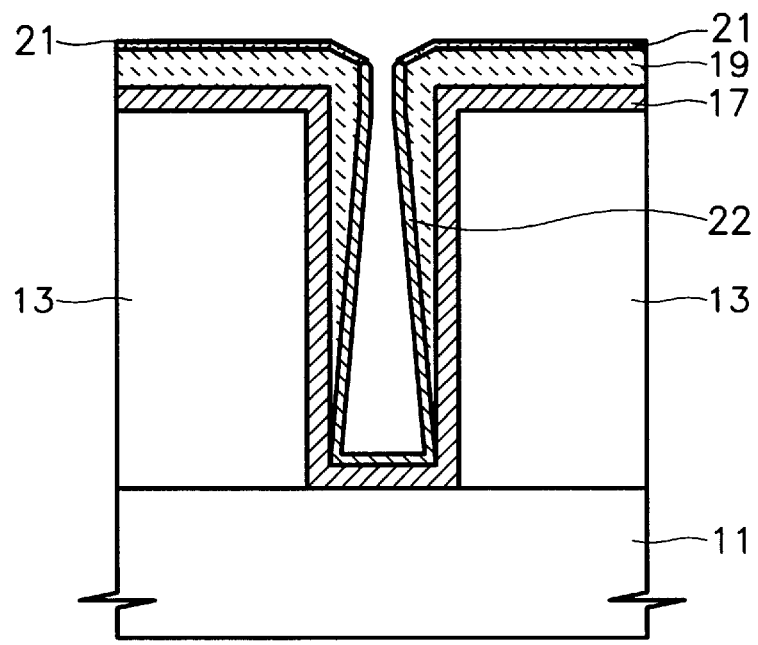

Referring to FIG. 5, a metal liner layer 22 is continuously formed on the exposed portions of the metal seed layer 19 and the barrier metal layer 21 where the anti-nucleation layer 21 was not deposited. The metal liner layer 22 may be continuously formed along the sidewalls and bottom of the contact hole 15 by chemical vapor deposition so as to exhibit excellent step coverage. At this time, the metal liner layer 22 is deposited so as not to block the upper part of the contact hole 15. Accordingly, in the embodiment of the present invention, the anti-nucleation layer 21 is not formed at the sidewalls and bottom of the contact hole 15, and thus it is possible to continuously form the metal liner layer 22 and bury the contact hole with a metal layer in a subsequent process. In this embodiment, the metal liner layer 22 is formed as an aluminum layer, however, other metals and metal alloys may be used.

Figure 6:
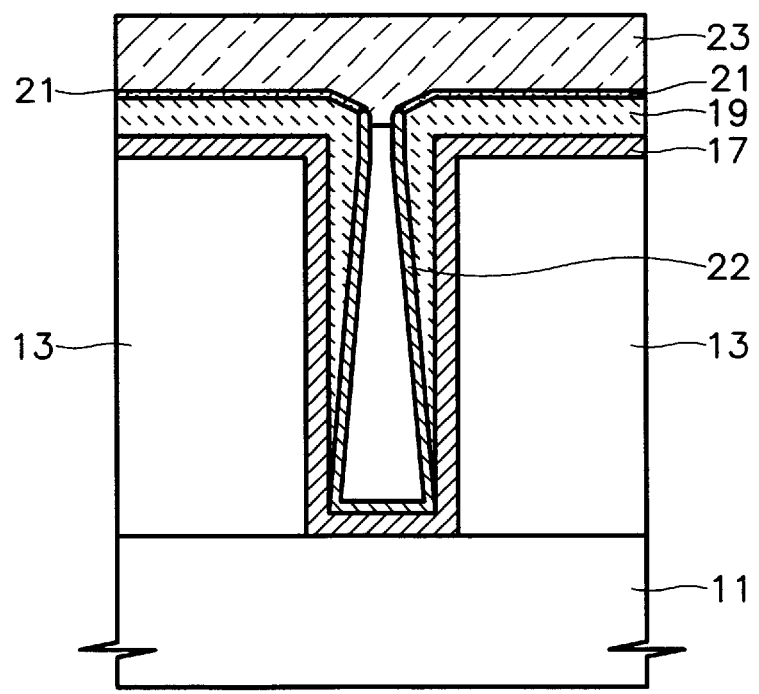
Figure 7:
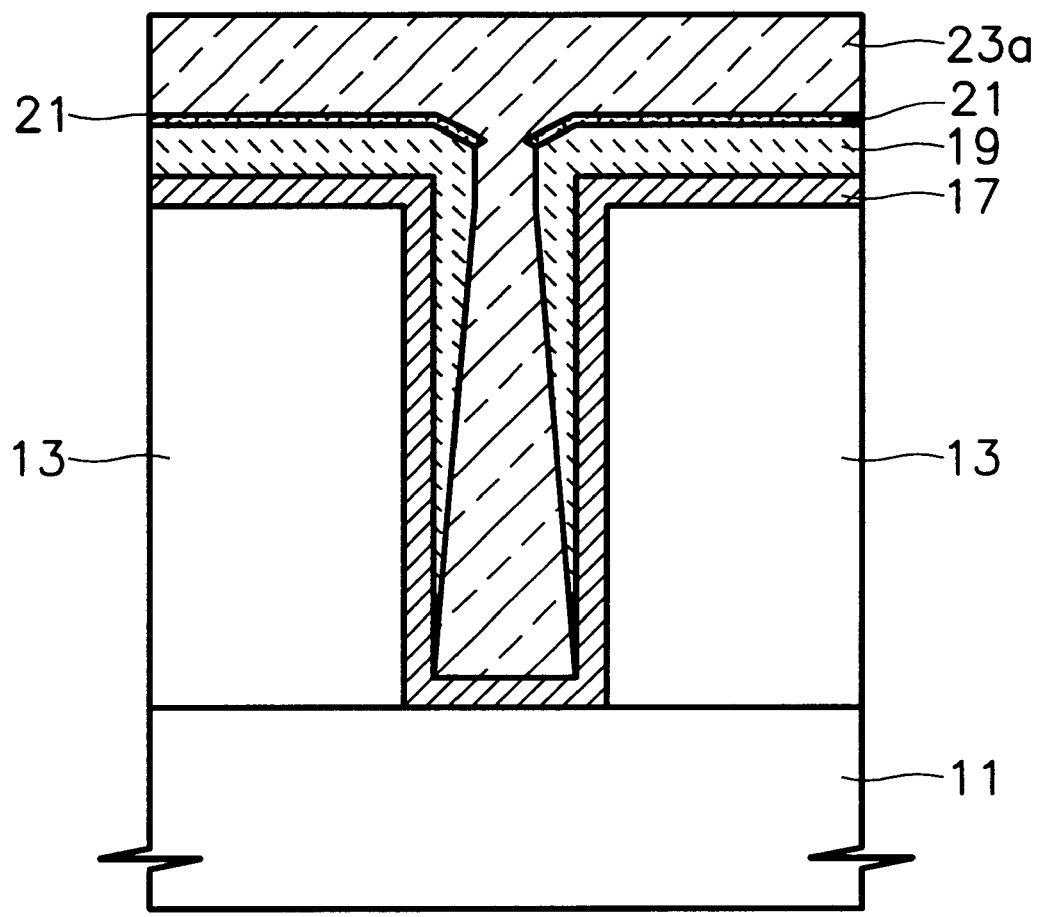

Referring to FIGS. 6 and 7, a metal layer 23 is formed on the entire surface of the semiconductor substrate on which the metal liner layer 22 is formed. The metal layer 23 may be formed as an aluminum layer using a PVD method, such as direct current magnetron sputtering. Next, the metal layer 23 is reflowed, thereby completely burying the contact hole 15 and forming a planarized metal wiring layer 23*a*. In FIG. 7, the metal liner layer 22 is not shown because the metal liner layer 22 and the metal wiring layer 23*a* preferably comprise the same material.

As described above, because of the metal seed layer 19 which overhangs the entrance of the contact hole 15 and makes the entrance width of the contact hole 15 smaller than the bottom width of the contact hole 15, the anti-nucleation layer 21 preferably does not form at the sidewalls and bottom of the contact hole 15. Accordingly, it is possible to bury the contact hole 15 with the metal layer 23 and thereby obtain a low resistance contact.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a metal interconnect, comprising the steps of:

forming an electrically insulating layer having a contact hole therein, on a substrate;

forming an electrically conductive seed layer that extends on a sidewall of the contact hole and on a portion of an upper surface of the electrically insulating layer extending adjacent the contact hole, and is sufficiently thick along an upper portion of the sidewall and sufficiently thin along a lower portion of the sidewall that an upper portion of the contact hole is partially constricted by the electrically conductive seed layer and a constricted contact hole is thereby defined;

forming an anti-nucleation layer on a portion of the electrically conductive seed layer that extends outside the constricted contact hole, using the constricted contact hole as a mask to inhibit formation of the anti-nucleation layer adjacent a bottom of the constricted contact hole; then forming a metal liner on a portion of the electrically conductive seed layer that defines a sidewall of the constricted contact hole; and then reflowing a metal interconnect layer into the constricted contact hole.

2. The method of claim 1, wherein said step of forming an anti-nucleation layer comprises the steps of:

depositing an oxidizable metal layer on a portion of the electrically conductive seed layer that extends outside the constricted contact hole, using the constricted contact hole as a mask to inhibit deposition of the oxidizable metal layer adjacent a bottom of the constricted contact hole; and then converting the oxidizable metal layer into the anti-nucleation layer by exposing the oxidizable metal layer to an oxygen-containing ambient.

3. The method of claim 2, wherein the oxidizable metal layer and the metal liner are the same material.

4. The method of claim 1, wherein the metal liner and the metal interconnect layer are the same material.

5. The method of claim 1, wherein said step of forming an electrically conductive seed layer is preceded by the step of forming a barrier metal layer that contacts the sidewall of the contact hole and the portion of an upper surface of the electrically insulating layer extending adjacent the contact hole; and wherein said step of forming an electrically conductive seed layer comprises forming an electrically conductive seed layer in contact with the barrier metal layer.

6. The method of claim 5, wherein the electrically conductive seed layer and the barrier metal layer are the same material.

7. The method of claim 6, wherein said step of forming a barrier metal layer comprises depositing the barrier metal layer using a first ratio of first and second source gases; and wherein said step of forming an electrically conductive seed layer comprises depositing the electrically conductive seed layer using a second ratio of the first and second source gases.

8. The method of claim 7, wherein a step coverage of the barrier metal layer is greater than a step coverage of the electrically conductive seed layer.

9. The method of claim 7, wherein said step of forming a barrier metal layer comprises depositing the barrier metal layer using first, second and third source gases; and wherein the first, second and third source gases comprise titanium chloride, ammonia and nitrogen, respectively.

10. The method of claim 7, wherein the first and second source gases comprise titanium chloride and ammonia, respectively.

11. The method of claim 10, wherein the first ratio of the first source gas to the second source gas is about eight (8) times greater than the second ratio of the first source gas to the second source gas.

12. The method of claim 10, wherein the electrically conductive seed layer comprises titanium nitride; wherein the anti-nucleation layer comprises aluminum oxide; and wherein the metal liner and the metal interconnect layer comprise aluminum.

13. The method of claim 1, wherein the electrically conductive seed layer comprises titanium nitride; wherein the anti-nucleation layer comprises aluminum oxide; and wherein the metal liner and the metal interconnect layer comprise aluminum.

14. A method for forming a metal wiring layer of a semiconductor device comprising the steps of:

forming an interlayer dielectric layer pattern having a contact hole therein, on the semiconductor substrate;

forming a barrier metal layer at a sidewall and bottom of the contact hole and on the interlayer dielectric layer pattern;

forming a metal seed layer so as to overhang an entrance of the contact hole and make an entrance width of the contact hole smaller than a bottom width of the contact hole;

forming an anti-nucleation layer on the metal seed layer formed at a top surface of the interlayer dielectric layer pattern;

continuously forming a metal liner layer on exposed portions of the metal seed layer and the barrier metal layer where the anti-nucleation layer was not deposited;

forming a metal layer on the anti-nucleation layer; and forming a metal wiring layer in the contact hole by reflowing the metal layer so as to fill the contact hole.

15. The method of claim 14, wherein the barrier metal layer is formed of one of a refractory metal layer and a refractory metal nitride layer.

16. The method of claim 15, wherein the barrier metal layer is formed of a titanium nitride layer.

17. The method of claim 14, wherein the metal seed layer is formed of one of a refractory metal layer and a refractory metal nitride layer.

18. The method of claim 14, wherein the metal seed layer is formed of a titanium nitride layer.

19. The method of claim 14, wherein the metal seed layer has a thickness of 150–300 Å.

20. The method of claim 14, wherein the barrier metal layer and the metal seed layer are formed by one of chemical vapor deposition, physical vapor deposition, ionized metal physical vapor deposition, collimated sputtering, or any combinations thereof.

21. The method of claim 14, wherein the anti-nucleation layer is formed of a metal oxide.

22. The method of claim 21, wherein the anti-nucleation layer is formed by depositing an easily oxidizing metal layer on the metal seed layer.

23. The method of claim 21, wherein the anti-nucleation layer is an aluminum oxide layer.

24. The method of claim 14, wherein the metal liner layer is formed by chemical vapor deposition.

25. The method of claim 14, wherein the metal liner layer and the metal layer are formed of aluminum.

26. The method of claim 14, wherein the metal liner layer is deposited so as not to block an upper part of the contact hole.

27. A metal interconnect, comprising:

a semiconductor substrate;

an electrically insulating layer having a contact hole therein, on the substrate;

an electrically conductive seed layer that extends on a sidewall of the contact hole and on a portion of an upper surface of the electrically insulating layer extending adjacent the contact hole and is absent from a floor of the contact hole, and is sufficiently thick along an upper portion of the sidewall and sufficiently thin along a lower portion of the sidewall that an upper portion of the contact hole is partially constricted by the electrically conductive seed layer and a constricted contact hole is thereby defined;

an anti-nucleation layer that extends on a portion of the electrically conductive seed layer extending outside the constricted contact hole, but not on a bottom of the constricted contact hole;

a metal liner on a portion of the electrically conductive seed layer that defines a sidewall of the constricted contact hole; and a metal interconnect layer that extends into the constricted contact hole and electrically contacts the metal liner and the anti-nucleation layer.

28. The metal interconnect of claim 27, wherein the metal liner comprises a first metal; and wherein the anti-nucleation layer comprises an oxide of the first metal.

29. The metal interconnect of claim 28, wherein the metal liner comprises aluminum; and wherein the anti-nucleation layer comprises aluminum oxide.

30. The metal interconnect of claim 27, wherein the electrically conductive seed layer comprises a refractory metal.

31. The metal interconnect of claim 27, further comprising a barrier metal layer that contacts the sidewall of the contact hole and the portion of an upper surface of the electrically insulating layer extending adjacent the contact hole; and wherein the barrier metal layer extends between the electrically conductive seed layer and the electrically insulating layer.

32. The metal interconnect of claim 31, wherein the barrier metal layer and the electrically conductive seed layer comprise the same material; and wherein step coverage characteristics of the barrier metal layer is greater than step coverage characteristics of the electrically conductive seed layer.

33. A method of forming a metal interconnect, comprising the steps of:

forming an electrically insulating layer having a contact hole therein, on a substrate;

depositing an electrically conductive barrier metal layer along a sidewall and bottom of the contact hole and on an upper surface of the electrically insulating layer, using a first composite gas having a first composition that provides a first degree of step coverage to the barrier metal layer; then depositing an electrically conductive seed layer that extends on the barrier metal layer and in the contact hole, using a second composite gas having a second composition that provides a second degree of step coverage to the seed layer that is less than the first degree of step coverage and causes the seed layer to overhang the contact hole; then forming an anti-nucleation layer on a portion of the seed layer extending outside the contact hole; then forming a metal liner on a portion of the seed layer extending within the contact hole; and then reflowing a metal interconnect layer into the contact hole.

34. The method of claim 33, wherein the metal liner and the metal interconnect layer comprise the same material.

35. The method of claim 33, wherein the first and second composite gases comprise different concentrations of the same constituent gases.

36. The method of claim 35, wherein the barrier metal layer and seed layer comprise titanium nitride; wherein the metal liner and metal interconnect layer consist of aluminum or alloys thereof; and wherein the anti-nucleation layer comprises aluminum oxide.

* * * * *